United States Patent
Wan et al.

(10) Patent No.: US 12,356,721 B2
(45) Date of Patent: Jul. 8, 2025

(54) ARRAY SUBSTRATE AND DISPLAY PANEL HAVING FANOUT LINES HAVING DIFFERENT RESISTANCES

(71) Applicant: SHENZHEN CHINA STAR OPTOELECTRONICS SEMICONDUCTOR DISPLAY TECHNOLOGY CO., LTD., Guangdong (CN)

(72) Inventors: Peng Wan, Guangdong (CN); Jianjian Ying, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 143 days.

(21) Appl. No.: 18/148,969

(22) Filed: Dec. 30, 2022

(65) Prior Publication Data
US 2024/0113133 A1     Apr. 4, 2024

(30) Foreign Application Priority Data
Sep. 29, 2022  (CN) .......................... 202211204608.7

(51) Int. Cl.
| | | |
|---|---|---|
| H10D 86/60 | (2025.01) | |
| G02F 1/1345 | (2006.01) | |
| G02F 1/1362 | (2006.01) | |
| H10D 86/40 | (2025.01) | |
| H10K 59/131 | (2023.01) | |

(52) U.S. Cl.
CPC ......... *H10D 86/60* (2025.01); *G02F 1/13454* (2013.01); *G02F 1/136286* (2013.01); *H10D 86/441* (2025.01); *G02F 2202/28* (2013.01); *H10K 59/131* (2023.02)

(58) Field of Classification Search
CPC .................... G02F 1/1345; G02F 1/136286
See application file for complete search history.

(56) References Cited

U.S. PATENT DOCUMENTS

| | | | |
|---|---|---|---|
| 2003/0189679 A1 | 10/2003 | Choi | |
| 2018/0239476 A1* | 8/2018 | Yoshida | ................ G06F 3/0443 |
| 2019/0355765 A1* | 11/2019 | Li | ......................... G02F 1/1362 |

FOREIGN PATENT DOCUMENTS

| | | |
|---|---|---|
| CN | 1746966 A | 3/2006 |
| CN | 102053434 A | 5/2011 |
| CN | 107092146 A | 8/2017 |
| CN | 108598088 A | 9/2018 |
| KR | 20080035369 A | 4/2008 |

OTHER PUBLICATIONS

Chinese Office Action issued in corresponding Chinese Patent Application No. 202211204608.7 dated Apr. 3, 2025, pp. 1-8.

* cited by examiner

*Primary Examiner* — Lauren Nguyen
(74) *Attorney, Agent, or Firm* — PV IP PC; Wei Te Chung

(57) ABSTRACT

The present application provides an array substrate and a display panel. A connecting area is located between a display area and a fanout area. A plurality of connecting lines and a plurality of coupling lines are located in the connecting area. Overlapping areas between the plurality of connecting lines and the plurality of coupling lines are negatively correlated with resistances of a plurality of fanout lines electrically connected to the plurality of connecting lines.

17 Claims, 7 Drawing Sheets

ARRAY SUBSTRATE AND DISPLAY PANEL HAVING FANOUT LINES HAVING DIFFERENT RESISTANCES

TECHNICAL FIELD

The present application relates to a field of display technologies, and specifically relates to an array substrate and a display panel.

BACKGROUND

Affected by various factors, signals may be delayed to varying degrees in a process of signal transmission. Uniformity of the signal transmission is affected, resulting in display quality problems in the display panel. For example, in a fanout area of the display panel, lengths of a plurality of signals lines are not same, so there are some differences in the resistance values of the plurality of signals lines, so that the signals transmitted by the plurality of signals lines have different delays, and there are differences in the signals transmitted to the display panel, thereby resulting in a poor dark band problem on the display panel and affecting the display quality of the display panel.

SUMMARY

The embodiments of the present application provide an array substrate and a display panel to improve a poor dark band problem.

The embodiments of the present application provide the array substrate including a display area, a fanout area, and a connecting area located between the display area and the fanout area; the array substrate further includes a plurality of fanout lines, a plurality of signal lines, a plurality of connecting lines, and a plurality of coupling lines.

The plurality of fanout lines are located in the fanout area, and resistances of the plurality of fanout lines are different; the plurality of signal lines are located in the display area; the plurality of connecting lines are located in the connecting area, and electrically connected between the plurality of fanout lines and the plurality of signal lines; and the plurality of coupling lines are located in the connecting area and disposed in different layers from the plurality of connecting lines.

Wherein in a top view, the plurality of connecting lines partially overlap the plurality of coupling lines, and overlapping areas between the plurality of connecting lines and the plurality of coupling lines are negatively correlated with the resistances of the plurality of fanout lines electrically connected to the plurality of connecting lines.

In some embodiments of the present application, the array substrate further includes a plurality of scanning lines and a plurality of gate driving circuits; the plurality of scanning lines are parallel to the plurality of coupling lines; and the plurality of gate driving circuits are electrically connected to the plurality of scanning lines and the plurality of coupling lines.

In some embodiments of the present application, the plurality of coupling lines and the plurality of scanning lines are in a same layer.

In some embodiments of the present application, the plurality of fanout lines include a first fanout line and a second fanout line, and a resistance of the first fanout line is greater than a resistance of the second fanout line; the plurality of signal lines include a first signal line and a second signal line; and the plurality of connecting lines include a first connecting line and a second connecting line, the first connecting line is electrically connected between the first signal line and the first fanout line, and the second connecting line is electrically connected between the second signal line and the second fanout line.

At least one of the plurality of coupling lines includes a first routing part and a coupling part electrically connected to the first routing part, and a width of the first routing part is less than a width of the coupling part; and wherein in the top view, the first connecting line partially overlaps the first routing part, and the second connecting line partially overlaps the coupling part.

In some embodiments of the present application, the second connecting line includes a second routing part and a connecting part electrically connected to the second routing part, and a width of the connecting part is greater than a width of the second routing part; wherein in the top view, the connecting part at least partially overlaps the coupling part.

In some embodiments of the present application, a length of the second connecting line is greater than a length of the first connecting line.

In some embodiments of the present application, the plurality of fanout lines further includes a plurality of third fanout lines, and a resistance of any one of the plurality of third fanout lines adjacent to the first fanout line is greater than a resistance of another one of the plurality of third fanout lines adjacent to the second fanout line; the plurality of signal lines further include a plurality of third signal lines; the plurality of connecting lines further include a plurality of third connecting lines located between the first connecting line and the second connecting line; and the plurality of third connecting lines are electrically connected between the plurality of third signal lines and the plurality of third fanout lines.

Wherein in the top view, a width of the coupling part adjacent to the first connecting line is less than a width of the coupling part adjacent to the second connecting line, and an overlapping area between any one of the plurality of third connecting lines and the coupling part adjacent to the first connecting line is less than an overlapping area between another one of the plurality of third connecting lines and the coupling part adjacent to the second connecting line.

In some embodiments of the present application, the plurality of fanout lines include a first fanout line, a second fanout line, and a plurality of third fanout lines, a resistance of the first fanout line is greater than a resistance of the second fanout line, and a resistance of any one of the plurality of third fanout lines adjacent to the first fanout line is greater than a resistance of another one of the plurality of third fanout lines adjacent to the second fanout line; the plurality of signal lines include a first signal line, a second signal line, and a plurality of third signal lines; the plurality of connecting lines include a first connecting line, a second connecting line, and a plurality of third connecting lines, the first connecting line is electrically connected between the first signal line and the first fanout line, the second connecting line is electrically connected between the second signal line and the second fanout line, and the plurality of third connecting lines are electrically connected between the plurality of third signal lines and the plurality of third fanout lines.

Wherein a length of the second connecting line is greater than a length of the first connecting line, and a length of any one of the plurality of third connecting lines adjacent to the first connecting line is less than a length of another one of the plurality of third connecting lines adjacent to the second connecting line.

The present application further provides a display panel including any of the above-mentioned array substrates, a color film substrate, and a frame glue; the color film substrate is disposed opposite to the array substrate; the frame glue is located between the array substrate and the color film substrate, and located on a side of the fanout area away from the connecting area.

The present application further provides a display panel including the above-mentioned array substrate and a light-emitting device layer located on the array substrate; the light-emitting device layer includes a plurality of light-emitting devices electrically connected to a plurality of signal lines of the array substrate.

The present application further provides a display device including any of the above-mentioned display panels.

The present application provides the array substrate, the display panel, and the display device. The connecting area is disposed between the fanout area and the display area. The plurality of connecting lines and the plurality of coupling lines are disposed in the connecting area. The overlapping areas between the connecting lines and the coupling lines are negatively correlated with the resistances of the fanout lines electrically connected to the connecting lines. Signal delay and loss differences caused by resistance differences of the plurality of fanout lines located in the fanout area are compensated, so that the signals transmitted by the plurality of signal lines located in the display area have similar losses and delays. Both the display panel and the display device include the array substrate to improve a display dark band problem.

DESCRIPTION OF DRAWINGS

To describe technical solutions of embodiments of the present application more clearly, the following briefly introduces accompanying drawings used in a description of the embodiments of the present application. Apparently, the accompanying drawings described below illustrate only some exemplary embodiments of the present application, and persons skilled in the art may derive other drawings from the drawings without making creative efforts.

DETAILED DESCRIPTION OF EMBODIMENTS

Figure 1:
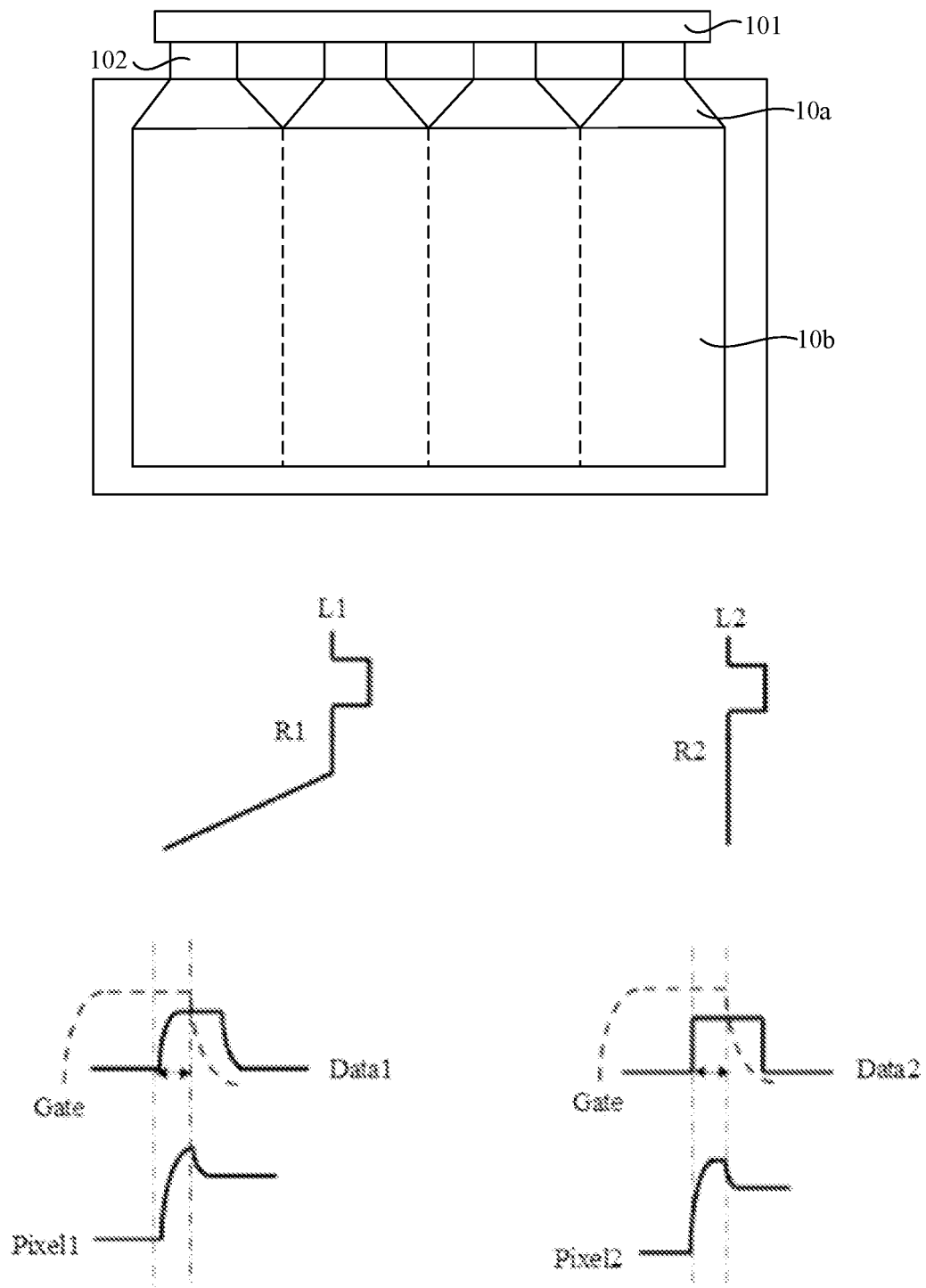
FIG. 1 is a schematic structural diagram of an array substrate and a waveform diagram of signal change in a prior art.

The technical solutions in embodiments of the present application will be described clearly and completely hereafter with reference to the accompanying drawings. Apparently, described embodiments are only a part of but not all embodiments of the present application. All other embodiments obtained by persons of ordinary skill in the art based on the embodiments of the present application without creative efforts shall fall within a protection scope of the present application. In addition, it should be understood that specific embodiments described herein are merely for explaining the present application, the term "embodiment" used in a context means an example, instance, or illustration, and the present application is not limited thereto. In the present application, location terms such as "up" and "down" are used in general to refer to up and down in actual use or operation of a device, in particular drawing directions in the drawings, without description to the contrary. While "inside" and "outside" are for the outline of the device.

Specifically, FIG. 1 is a schematic structural diagram of an array substrate and a waveform diagram of signal change in a prior art. Taking signals transmitted by signal lines as data signals, the data signals are transmitted from a circuit board 101 to data lines through a chip on flex 102 and fanout lines. The data lines are located in a display area 10b, and the fanout lines are located in a fanout area 10a. Sub-pixels located in the display area 10b are electrically connected to the data lines to display according to the data signals. During a process of transmitting the data signals from the circuit board 101 to the sub-pixels, the data signals may be affected by various factors (such as space limitation, process capability, etc.), so that the data signals transmitted in the data lines may be delayed, thereby affecting charging effect of the sub-pixels and seriously resulting in a vertical dark band problem.

For example, affected by a frame size of the display panel itself and a specification of the chip on flex, the fanout area 10a may be designed to be trapezoidal. Correspondingly, there will be length differences between the fanout lines located in the fanout area 10a, so that there are resistance differences between the fanout lines located in the fanout area 10a, and data signals transmitted through the fanout lines have different delay effects, thereby resulting in a poor dark band problem and affecting display quality of the display panel. Specifically, a length of a fanout line L2 is less than a length of a fanout line L1, wherein the fanout line L1 is located in a middle of the fanout area 10a, and the fanout line L2 is located on both sides of the fanout area 10a. Therefore, a resistance R1 of the fanout line L1 is greater than a resistance R2 of the fanout line L2. Compared with a data signal Data2 transmitted through the fanout line L2, a data signal Data1 transmitted through the fanout line L1 has a delay and loss difference, so there is a difference between a pixel voltage Pixel 1 and a pixel voltage Pixel 2 transmitted to corresponding sub-pixels. Furthermore, in the processes of manufacturing the chip on flex 102 and the data lines, affected by limitations of process conditions and process capability, there will be differences in resistance and capacitance, resulting in the dark band problem. Especially, it is especially obvious in high-frequency and high-resolution display panels. Wherein, Gate represents a scanning signal.

In view of this, the present application provides an array substrate, a display panel, and a display device, so as to improve the dark band problem. Specifically, FIG. 2A-FIG. 2D are schematic structural diagrams of the array substrate provided by the embodiment of the present application.

The array substrate includes a display area 201a, a fanout area 202a, and a connecting area 203a located between the display area 201a and the fanout area 202a. The array substrate includes a plurality of signal lines 201, a plurality of fanout lines 202, a plurality of connecting lines 203, and a plurality of coupling lines 204.

The plurality of fanout lines 202 are located in the fanout area 202a, and resistances of the plurality of fanout lines 202 are different. In an embodiment, lengths of the plurality of fanout lines 202 are different, so that the resistances of the plurality of fanout lines 202 are different. In an embodiment, there is a line change (that is, the line change is formed by electrical connections of lines with different resistivity)

between some of the plurality of fanout lines 202, so that the resistances of the plurality of fanout lines 202 are different. In an embodiment, affected by processes, cross sections of the plurality of fanout lines 202 are different, so that the resistances of the plurality of fanout lines 202 are different.

The plurality of signal lines 201 are located in the display area 201a. In an embodiment, the plurality of signal lines 201 include data lines, and the data lines are configured to output data signals. In an embodiment, the plurality of signal lines 201 further include a plurality of scanning lines, the plurality of scanning lines are configured to output a plurality of scanning signals.

The plurality of connecting lines 203 are located in the connecting area 203a. The plurality of connecting lines 203 are electrically connected between the plurality of fanout lines 202 and the plurality of signal lines 201.

The plurality of coupling lines 204 are located in the connecting area 203a. The plurality of coupling lines 204 are in different layers from the plurality of connecting lines 203. It may be understood that an insulating layer is further disposed between a film layer on which the plurality of coupling lines 204 are located and a film layer on which the plurality of connecting lines 203 are located, so as to prevent short circuits between the plurality of coupling lines 204 and the plurality of connecting lines 203.

In a top view, the plurality of connecting lines 203 partially overlap the plurality of coupling lines 204. Overlapping areas between the plurality of connecting lines 203 and the plurality of coupling lines 204 are negatively correlated with the resistances of the plurality of fanout lines 202 electrically connected to the plurality of connecting lines 203. That is, the greater the resistances of the fanout lines 202, the smaller the overlapping areas of the connecting lines 203 and the coupling lines 204, so that coupling capacitances formed by the connecting lines 203 and the coupling lines 204 are smaller. The smaller the resistances of the fanout lines 202, the greater the overlapping areas of the connecting lines 203 and the coupling lines 204, so that the coupling capacitances formed by the connecting lines 203 and the coupling lines 204 are greater.

Correspondingly, the plurality of fanout lines 202 include a first fanout line 2021 and a second fanout line 2022. If a resistance of the first fanout line 2021 is greater than a resistance of the second fanout line 2022. The plurality of connecting lines 203 include a first connecting line 2031 and a second connecting line 2032. The first connecting line 2031 is electrically connected between the first signal line 2011 and the first fanout line 2021, and the second connecting line 2032 is electrically connected between the second signal line 2012 and the second fanout line 2022. Therefore, a total capacitance corresponding to the first fanout line 2021, the first signal line 2011, and the first connecting line 2031 is less than a total capacitance corresponding to the second fanout line 2022, the second signal line 2012, and the second connecting line 2032. This improves signal delay and loss differences caused by a resistance difference between the first fanout line 2021 and the second fanout line 2022, so that the signals transmitted by the plurality of signal lines 201 located in the display area 201a have similar loss and delay.

The plurality of connecting lines 203 partially overlap the plurality of coupling lines 204, so that a plurality of coupling capacitors are correspondingly provided between the plurality of connecting lines 203 and the plurality of coupling lines 204. The overlapping areas between the plurality of connecting lines 203 and the plurality of coupling lines 204 are negatively correlated with the resistances of the plurality of fanout lines 202 electrically connected to the plurality of connecting lines 203, so as to control that coupling capacitances corresponding to the connecting lines 203 connected to the fanout lines 202 with different resistances are further different. Signal delays and loss difference caused by a total capacitance of the fanout lines 202, the connecting lines 203, and the signal lines 201 connected cancel out signal delays and loss differences caused by resistance differences of the fanout lines 202. This makes that the signals transmitted by the plurality of the signal lines located in the display area have similar losses and delays, thereby improving the display dark band problem.

In an embodiment, in the top view, the plurality of connecting lines 203 partially overlap the plurality of coupling lines 204. The overlapping areas between the plurality of connecting lines 203 and the plurality of coupling lines 204 are negatively correlated with the resistances of the plurality of fanout lines 202 electrically connected to the plurality of connecting lines 203. Signal delays and loss differences caused by the resistance differences of the plurality of fanout lines 202 located in the fanout area are compensated, so that the signals transmitted by the plurality of signal lines 201 located in the display area 201a have similar losses and delays.

In an embodiment, the array substrate further includes a plurality of sub-pixels. The plurality of sub-pixels are located in the display area 201a. The plurality of sub-pixels are electrically connected to the plurality of signal lines 201. For example, when the plurality of signal lines 201 include the plurality of data lines, the plurality of data lines are electrically connected to the plurality of sub-pixels, so that the plurality of sub-pixels are displayed according to the data signals transmitted by the plurality of data lines. When the plurality of signal lines 201 includes the plurality of scanning lines, the plurality of scanning lines are electrically connected to the plurality of sub-pixels, so as to control display time of the plurality of sub-pixels.

In an embodiment, the array substrate further includes a plurality of gate driving circuits. The plurality of scanning lines are electrically connected to the plurality of sub-pixels, and the plurality of scanning lines are parallel to the plurality of coupling lines 204. The plurality of gate driving circuits are electrically connected to the plurality of scanning lines and the plurality of coupling lines 204. The plurality of gate driving circuits are configured to generate the scanning signals. Both the plurality of coupling lines 204 and the scanning lines are configured to transmit the scanning signals.

In an embodiment, the coupling lines 204 may be multiplexed with the signal lines in the array substrate. For example, in some array substrates, virtual scanning lines are disposed in the connecting area 203a to ensure uniformity of the scanning signals. The virtual scanning lines are multiplexed into the plurality of coupling lines 204. The virtual scanning lines are configured to transmit the scanning signals.

In an embodiment, the plurality of coupling lines 204 and the plurality of scanning lines are in a same layer to save the processes.

In an embodiment, shapes, lengths, widths, sizes, and other parameters of the connecting lines 203 and/or the coupling lines 204 may be changed, so as to compensate correspondingly signal delays and loss differences caused by the resistance differences between the plurality of fanout lines 202, so that the signals transmitted by the plurality of signal lines 201 located in the display area 201a have similar losses and delays, thereby improving the display dark band problem.

Specifically, continuing to refer to FIG. 2A-FIG. 2D, still taking the plurality of signal lines 201 including the first signal line 2011 and the second signal line 2012, the plurality of fanout lines 202 including the first fanout line 2021 and the second fanout line 2022, and the plurality of connecting lines 203 including a first connecting line 2031 and a second connecting line 2032 as an example to illustrate.

The resistance of the first fanout line 2021 is greater than the resistance of the second fanout line 2022. In an embodiment, a length of the first fanout line 2021 is greater than a length of the second fanout line 2022, so that the resistance of the first fanout line 2021 is greater than the resistance of the second fanout line 2022.

The first connecting line 2031 is electrically connected between the first signal line 2011 and the first fanout line 2021, and the second connecting line 2032 is electrically connected between the second signal line 2012 and the second fanout line 2022.

Figure 2A:
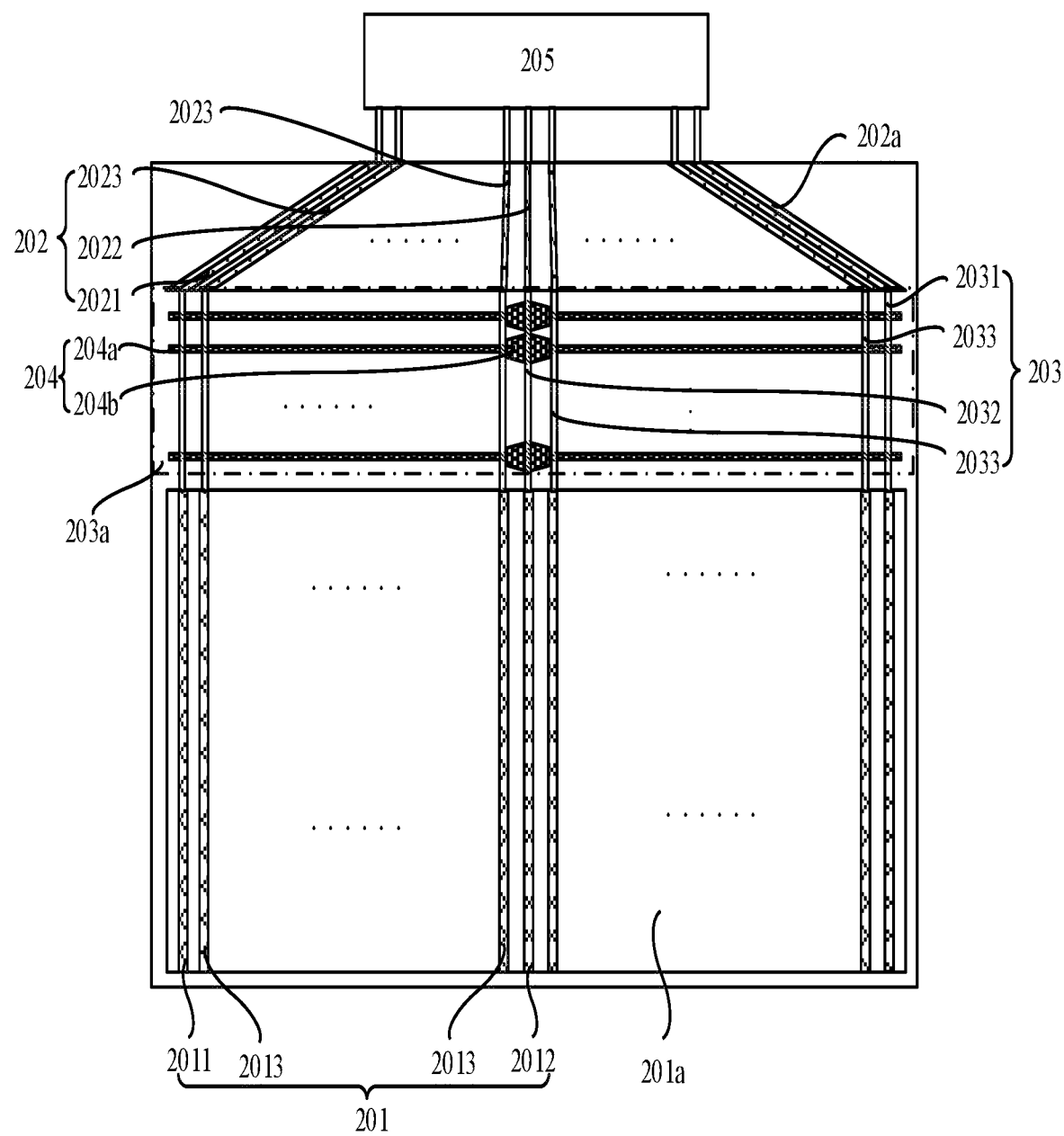
FIG. 2A-FIG. 2D are schematic structural diagrams of an array substrate provided by an embodiment of the present application.

In an embodiment, at least one of the plurality of coupling lines 204 includes a first routing part 204a and a coupling part 204b electrically connected to the first routing part 204a. A width of the first routing part 204a is less than a width of the coupling part 204b. In the top view, the first connecting line 2031 partially overlaps the first routing part 204a, and the second connecting line 2032 partially overlaps the coupling part 204b. As shown in FIG. 2A, an overlapping area of the first connecting line 2031 and the coupling lines 204 is less than an overlapping area of the second connecting line 2032 and the coupling lines 204. A coupling capacitance formed by the first connecting line 2031 and the coupling lines 204 is less than a coupling capacitance formed by the second connecting line 2032 and the coupling lines 204. The signal delays and the loss differences caused by the resistance differences between the first fanout line 2021 and the second fanout line 2022 are correspondingly compensated, so that the signals transmitted by the plurality of signal lines 201 located in the display area 201a have similar losses and delays. Wherein, both the width of the first routing part 204a and the width of the coupling part 204b refer to sizes of the coupling lines 204 perpendicular to an extension direction of the coupling lines 204.

It may be understood that, according to the resistance differences between the plurality of fanout lines 202, a part of the plurality of coupling lines 204 may be selected to be provided with the coupling part 204b, while the coupling line 204 not provided with the coupling part 204b may merely include the first routing part 204a.

Figure 2B:
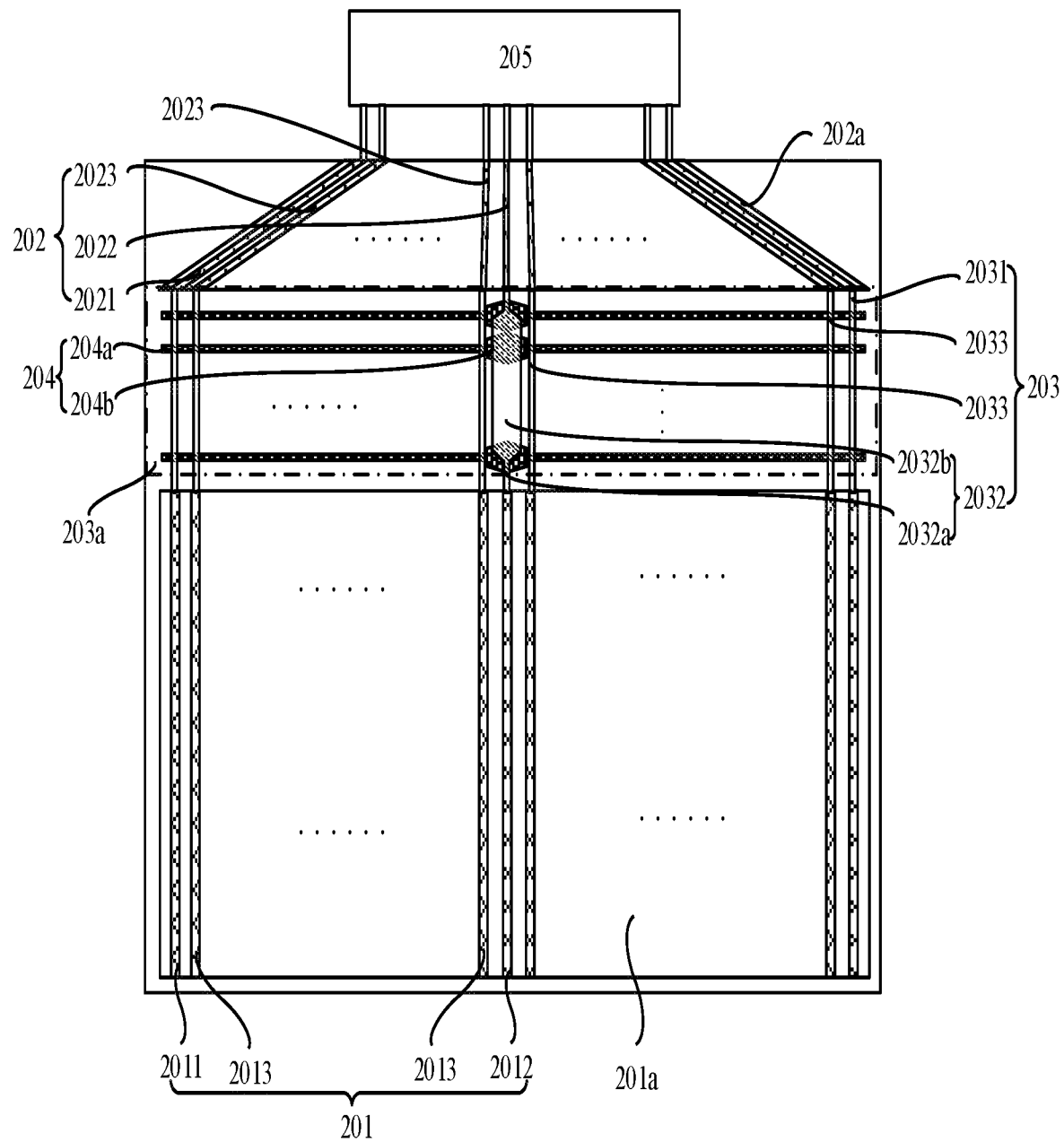

In an embodiment, the second connecting line 2032 includes a second routing part 2032a and a connecting part 2032b electrically connected to the second routing part 2032a. A width of the connecting part 2032b is greater than the width of the first routing part 204a and a width of the second routing part 2032a. As shown in FIG. 2B, in the top view, the connecting part 2032b at least partially overlaps the coupling part 204b to increase an overlapping area of the second connecting line 2032 and the coupling lines 204. A coupling capacitance formed by the second connecting line 2032 and the coupling lines 204 is increased. The signal delays and the loss differences caused by the resistance differences between the first fanout line 2021 and the second fanout line 2022 are correspondingly compensated, so that the signals transmitted by the plurality of signal lines located in the display area 201a have similar losses and delays. Wherein, both the width of the connecting part 2032b and the width of the second routing part 2032a refer to sizes of the connecting lines 203 perpendicular to an extension direction of the connecting lines 203.

Figure 2C:
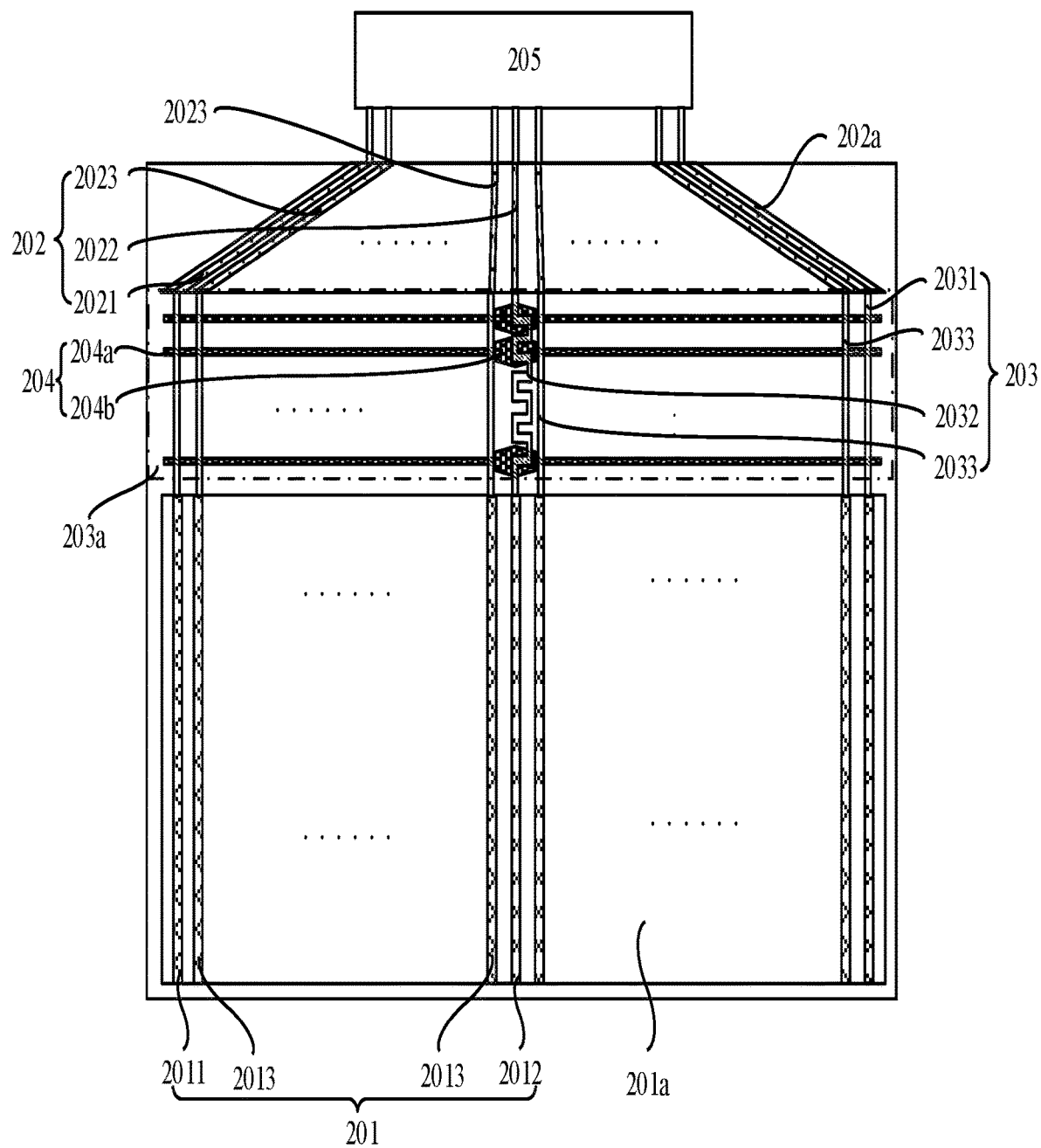

In an embodiment, in addition to increasing a width of the second connecting line 2032, a resistance of the second connecting line 2032 may further be increased by increasing a length of the second connecting line 2032 to increase the coupling capacitance formed by the second connecting line 2032 and the coupling lines 204. The signal delays and the loss differences caused by the resistance differences between the first fanout line 2021 and the second fanout line 2022 are correspondingly compensated, so that the signals transmitted by the plurality of signal lines 201 located in the display area 201a have similar losses and delays. In an embodiment, As shown in FIG. 2C, the length of the second connecting line 2032 is greater than a length of the first connecting line 2031. In an embodiment, a route shape of the second connecting line 2032 may be in a form of a serpentine route.

In an embodiment, continuing to refer to FIG. 2A-FIG. 2C, the plurality of fanout lines 202 further include a plurality of third fanout lines 2023. A resistance of any one of the plurality of third fanout lines 2023 adjacent to the first fanout line 2021 is greater than a resistance of another one of the plurality of third fanout lines 2023 adjacent to the second fanout line 2022. In an embodiment, a length of any one of the plurality of third fanout lines 2023 adjacent to the first fanout line 2021 is greater than a length of another one of the plurality of third fanout lines 2023 adjacent to the second fanout line 2022, so that the resistance of any one of the plurality of third fanout lines 2023 adjacent to the first fanout line 2021 is greater than the resistance of another one of the plurality of third fanout lines 2023 adjacent to the second fanout line 2022.

The plurality of signal lines 201 further include a plurality of third signal lines 2013. The plurality of connecting lines 203 further include a plurality of third connecting lines 2033 located between the first connecting line 2031 and the second connecting line 2032. The plurality of third connecting lines 2033 are electrically connected between the plurality of third signal lines 2013 and the plurality of third fanout lines 2023.

In an embodiment, in the top view, a width of the coupling part 204b adjacent to the first connecting line 2031 is less than a width of the coupling part 204b adjacent to the second connecting line 2032. An overlapping area between any one of the plurality of third connecting lines 2033 and the coupling part 204b adjacent to the first connecting line 2031 is less than an overlapping area between another one of the plurality of third connecting lines 2033 and the coupling part 204b adjacent to the second connecting line 2032. In a direction from the second connecting line 2032 adjacent to the first connecting line 2031, a coupling capacitance formed by the plurality of third connecting lines 2033 and the coupling part 204b is decreased. The signal delays and the loss differences caused by the resistance differences between the first fanout line 2021, the second fanout line 2022, and the third fanout lines 2023 are correspondingly compensated, so that the signals transmitted by the plurality of signal lines 201 located in the display area 201a have similar losses and delays.

In an embodiment, at least one of the coupling lines 204 includes one coupling part 204b. The width of the coupling part 204b adjacent to the first connecting line 2031 is less than the width of the coupling part 204b adjacent to the second connecting line 2032, so that both the plurality of third connecting lines 2033 and the second connecting line 2032 overlap the coupling part 204b.

In an embodiment, at least one of the coupling lines 204 includes a plurality of coupling parts 204b. Areas of the plurality of coupling parts 204b gradually decrease in the direction from the second connecting line 2032 adjacent to the first connecting line 2031. In an embodiment, the plurality of coupling parts 204b include a plurality of first coupling parts and a second coupling part. A width of each of the plurality of first coupling parts is less than a width of the second coupling part, and/or a length of each of the first coupling parts is less than a length of the second coupling part. A width of any one of the plurality of first coupling parts adjacent to the first connecting line 2031 is less than a width of another one of the plurality of first coupling parts adjacent to the second connecting line 2032, and/or a length of any one of the plurality of first coupling parts adjacent to the first connecting line 2031 is less than a length of another one of the plurality of first coupling parts adjacent to the second connecting line 2032. Wherein, in the top view, the second connecting line 2032 overlaps the second coupling part, and the plurality of third connecting lines 2033 overlap the plurality of first coupling parts. An overlapping area between the third connecting lines 2033 and the first coupling parts adjacent to the first connecting line 2031 is less than an overlapping area between the plurality of third connecting lines and the first coupling parts 2031 adjacent to the second connecting line 2032, so that the coupling capacitance formed by the plurality of third connecting lines 2033 and the coupling part 204b is decreased. The signal delay and the loss differences caused by the resistance differences between the first fanout line 2021, the second fanout line 2022, and the third fanout line 2023 are compensated correspondingly, so that the signals transmitted by the plurality of signal lines 201 located in the display area 201a have similar losses and delays.

Figure 2D:
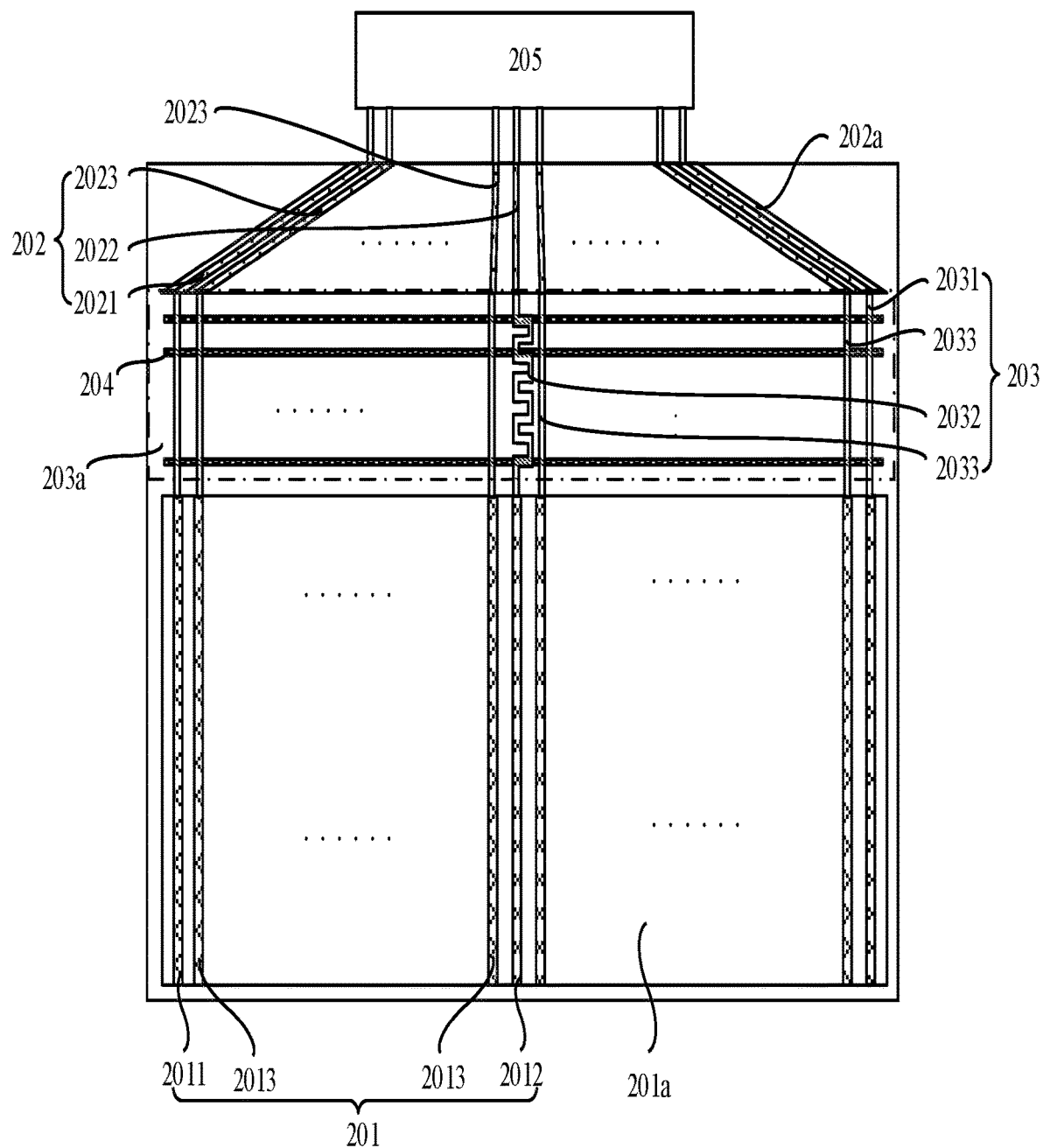

Continuing to refer to FIG. 2D, the resistance differences between the plurality of fanout lines 202 may be improved by individually changing the lengths of the connecting lines 203. Specifically, the plurality of fanout lines include the first fanout line 2021, the second fanout line 2022, and the plurality of third fanout lines 2023. The resistance of the first fanout line 2021 is greater than the resistance of the second fanout line 2022. A resistance of any one of the plurality of third fanout lines 2023 adjacent to the first fanout line 2021 is greater than a resistance of another one of the plurality of third fanout lines 2023 adjacent to the second fanout line 2022.

The plurality of signal lines include the first signal line 2011, the second signal line 2012, and the plurality of third signal lines 2013. The plurality of connecting lines include the first connecting line 2031, the second connecting line 2032, and the plurality of third connecting lines 2033. The first connecting line 203 is electrically connected between the first signal line 2011 and the first fanout line 2021. The second connecting line 2032 is electrically connected between the second signal line 2012 and the second fanout line 2022. The plurality of third connecting lines 2033 are electrically connected between the plurality of third signal lines 2013 and the plurality of third fanout lines 2023.

Wherein the length of the second connecting line 2032 is greater than the length of the first connecting line 2031. A length of any one of the plurality of third connecting lines 2033 adjacent to the first connecting line 2031 is less than a length of another one of the plurality of third connecting lines 2033 adjacent to the second connecting line 2032, so that the resistance differences between the plurality of connecting lines 203 are complementary to the resistance differences between the plurality of fanout lines 202, thereby improving the display dark band problem. In an embodiment, the route shape of the second connecting line 2032 may be in the form of the serpentine route.

In an embodiment, an extension direction of the coupling lines 204 is equal to an extension direction of the connecting lines 203 may be same.

It may be understood that those skilled in the art may change layout forms of the first fanout line 2021, the second fanout line 2022, and the third fanout line 2023 according to actual demands. That is, the layout forms of the first fanout line 2021, the second fanout line 2022, and the third fanout line 2023 are not limited to a form shown in FIG. 2A-FIG. 2D.

It may be understood that FIG. 2A-FIG. 2D takes the resistance differences caused by the different lengths of the plurality of fanout lines 202 as an example to illustrate. For the dark band problem caused by the line change, resistivity differences of the fanout lines 202, the resistance differences of the plurality of fanout lines 202 affected by the processes, etc., those skilled in the art may continue to use a design of the connecting line 203 and the coupling line 204 in the present application.

It may be understood that the lengths, the extension directions, the shapes, the widths, etc. of the coupling part 204b, the connecting lines 203, and the coupling lines 204 may be provided according to the actual demands. The extension direction and the shape of the signal lines 201 in the display area 201a may further be provided according to the actual demands.

In an embodiment, the fanout lines 202 are electrically connected to a chip on film 205.

FIG. 3A-FIG. 3D are schematic structural diagrams of a display panel provided by an embodiment of the present application. The present application further provides a display panel. The display panel includes any of the above-mentioned array substrates 300. In an embodiment, the display panel includes a self-luminous display panel or a passive luminous display panel. The self-luminous display panel includes light-emitting devices such as organic light-emitting diodes, mini light-emitting diodes, and micro light-emitting diodes. The passive luminous display panel includes a liquid crystal display panel, a quantum dot display panel, etc.

Figure 3A:
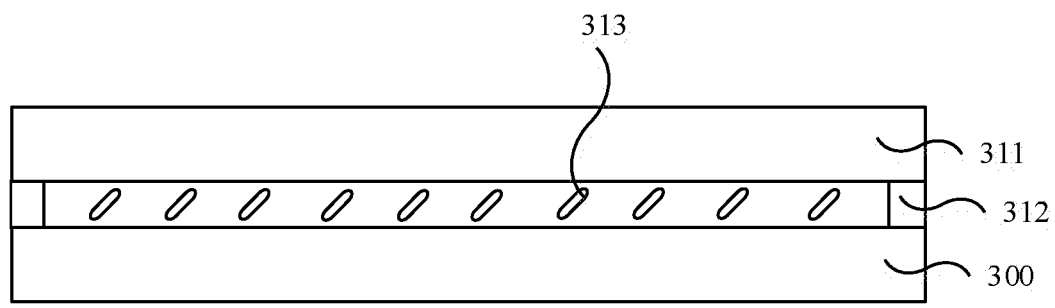
FIG. 3A-FIG. 3B are schematic structural diagrams of a display panel provided by an embodiment of the present application.

In an embodiment, continuing to refer FIG. 3A, the display panel further includes a color film substrate 311 and a frame glue 312.

The color film substrate 311 is disposed opposite to the array substrate 300. In an embodiment, the color film substrate 311 includes a black matrix, a color filter, etc.

The frame glue 312 is located between the array substrate 300 and the color film substrate 311, and the frame glue 312 is located on a side of the fanout area 202a away from the connecting area 203a.

A distance between the frame glue 312 and the connecting area 203a is greater than a distance between the frame glue 312 and the fanout area 202a, and the fanout area 202a is adjacent to an edge cutting area. Therefore, compared a design of providing with the coupling lines 204 in the fanout area 202a, providing with the coupling lines 204 in the connecting area 203a may reduce risk of the coupling lines 204 being eroded by water and oxygen. Due to the water-oxygen erosion, the coupling lines 204 are corroded which results in the resistance differences of the fanout lines 202, and advantages of compensating effect of the signal delays and the loss differences caused by the resistance differences of the fanout lines 202.

Furthermore, the frame glue 312 further includes conductive particles for conducting electricity. Therefore, if the coupling lines 204 are disposed in the fanout area 202a, the coupling line 204 may cause short circuits or static electricity problems with the fanout lines 202 or other signal lines through the conductive particles in the frame glue 312, thereby affecting functions of the display panel.

In an embodiment, the display panel further includes liquid crystal molecules 313, an alignment film, and the like not shown between the array substrate 300 and the color film substrate 311.

Figure 3B:
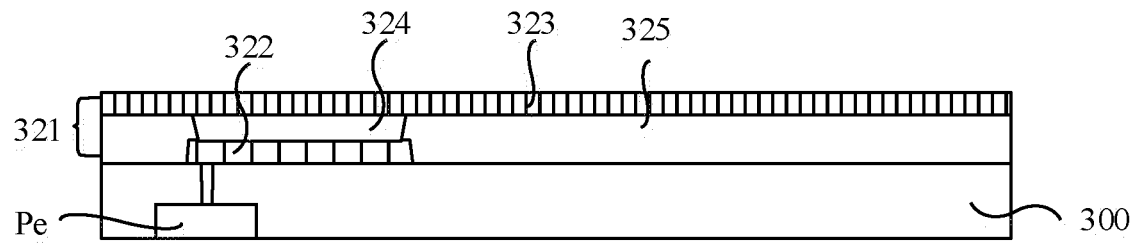

Continuing to refer to FIG. 3B, the display panel further includes a light-emitting device layer 321, and the light-emitting device layer 321 is located on the array substrate 300. The light-emitting device layer 321 includes a plurality of light-emitting devices, and the plurality of light-emitting devices are electrically connected to the plurality of signal lines.

In an embodiment, the array substrate 300 includes a plurality of pixel driving circuits Pe. The plurality of pixel driving circuits Pe are electrically connected to the plurality of signal lines and the plurality of light-emitting devices. The plurality of pixel driving circuits Pe are configured to drive the plurality of light-emitting devices emit light.

In an embodiment, the pixel driving circuits Pe includes at least one transistor. The signal lines are electrically connected with one of a source electrode and a drain electrode of the transistor. The transistor is configured to drive the corresponding light-emitting devices to emit light according to the signals transmitted by the signal lines.

In an embodiment, the emitting devices include the organic light-emitting diodes, the mini light-emitting diodes, and the micro light-emitting diodes.

In an embodiment, the emitting devices include a first electrode 322, a second electrode 323, and a light emitting layer 324 located between the first electrode 322 and the second electrode 323. The light-emitting layer 324 is located in a pixel-defining area of a pixel-defining layer 325. In an embodiment, the first electrode 322 is electrically connected to the transistor of the corresponding pixel driving circuit Pe. The first electrode 322 is located on a side of the second electrode 323 adjacent to the array substrate 300.

Figure 4A:
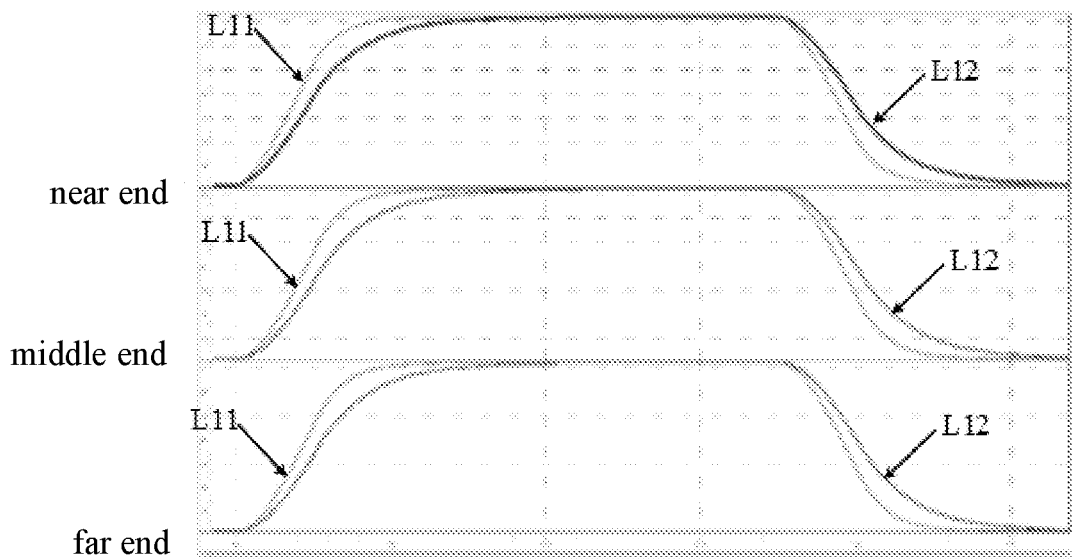
FIG. 4A-FIG. 4B are comparison diagrams of simulation results.
Figure 4B:
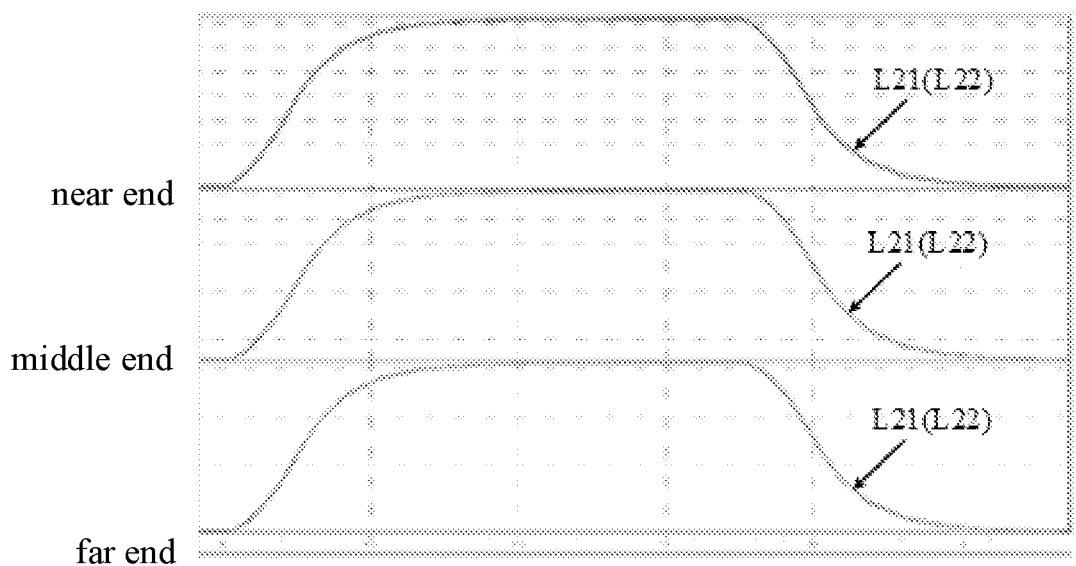

FIG. 4A-FIG. 4B are comparison diagrams of simulation results. Taking the signal lines 201 as the data lines for transmitting the data signals as an example, FIG. 4A is a schematic diagram showing changes in the data signals obtained without compensating the resistance differences between the plurality of fanout lines 202. FIG. 4B is a schematic diagram showing changes in the data signals obtained after compensating the resistance differences between the plurality of fanout lines 202 according to solutions shown in FIG. 2A-FIG. 2D.

The data lines located in the display area 201a are divided into a far end, a middle end, and a near end according to a distance from the fanout area 202a in an extending direction of the data lines. Before being compensated, the plurality of fanout lines 202 have resistance differences, and loss of a same data signal at different positions of a same data line is different. Therefore, when the data signals transmitted through the fanout lines 202 having different resistance differences are transmitted to the data lines located in the display area 201a, the data signals exhibit different signal quantities. Specifically, as shown in FIG. 4A, when a data signal transmitted through a fanout line 202 having a minimum resistance is transmitted to a data line located in the display area 201a, a signal quantity displayed by the data signal is L11 as shown in FIG. 4A. When a data signal transmitted through a fanout line 202 having a Maximum resistance is transmitted to a data line located in the display area 201a, a signal quantity displayed by the data signal is L12 as shown in FIG. 4A. L11 and L12 are not same. No matter at the far end, the near end, or the middle end of the data line, there are signal amount differences of the data signal caused by the resistance differences of the fanout line 202. After the present application is adopted, no matter at the far end, the near end, or the middle of the data line, the signal amount difference of the data signal caused by the resistance differences of the fanout line 202 is improved. Specifically, as shown in FIG. 4B, when the data signal transmitted through the fanout line 202 having the minimum resistance is transmitted to the data line located in the display area 201a, a signal quantity displayed by the data signal is L21 as shown in FIG. 4B. When the data signal transmitted through the fanout line 202 having the maximum resistance is transmitted to the data line located in the display area 201a, a signal quantity displayed by the data signal is L22 as shown in FIG. 4B. L21 and L22 are same, and L21 and L22 almost coincide, indicating that semaphore difference exhibited by the data signal due to the resistance differences of the fanout lines 202 is improved, thereby improving the display dark band problem.

The present application further provides a display device, the display device includes any of the above-mentioned driving circuits or any of the above-mentioned display panels.

It may be understood that the display device includes a movable display device (such as a notebook computer, a mobile phone, etc.), a fixed terminal (such as a desktop computer and a TV), a measuring device (such as a sports bracelet and a thermometer), etc.

The embodiments of the present application are described in detail above. The principle and implementations of the present application are described in this specification by using specific examples. The descriptions about the foregoing embodiments are merely provided to help understand the method and core ideas of the present application. In addition, persons of ordinary skill in the art can make modifications in terms of the specific implementations and application scopes according to the ideas of the present application. Therefore, the content of this specification shall not be construed as a limit to the present application.

What is claimed is:

1. An array substrate, comprising a display area, a fanout area, and a connecting area located between the display area and the fanout area; wherein the array substrate further comprises:
    a plurality of fanout lines located in the fanout area, wherein resistances of the plurality of fanout lines are different;
    a plurality of signal lines located in the display area;
    a plurality of connecting lines located in the connecting area, and electrically connected between the plurality of fanout lines and the plurality of signal lines; and
    a plurality of coupling lines located in the connecting area, and disposed in different layers from the plurality of connecting lines;
    wherein in a top view, the plurality of connecting lines partially overlap the plurality of coupling lines, overlapping areas between the plurality of connecting lines and the plurality of coupling lines are negatively correlated with the resistances of the plurality of fanout lines electrically connected to the plurality of connecting lines wherein the plurality of fanout lines comprise a first fanout line and a second fanout line, and a resistance of the first fanout line is greater than a resistance of the second fanout line; the plurality of signal lines comprise a first signal line and a second signal line; the plurality of connecting lines comprise a first connecting line and a second connecting line, the first connecting line is electrically connected between the first signal line and the first fanout line, and the second connecting line is electrically connected between the second signal line and the second fanout line; and wherein at least one of the plurality of coupling lines comprises a first routing part and a coupling part electrically connected to the first routing part, and a width of the first routing part is less than a width of the coupling part, and wherein in the top view, the first connecting line partially overlaps the first routing part, and the second connecting line partially overlaps the coupling part.

2. The array substrate according in claim 1, further comprising:
   a plurality of scanning lines parallel to the plurality of coupling lines; and
   a plurality of gate driving circuits electrically connected to the plurality of scanning lines and the plurality of coupling lines.

3. The array substrate according in claim 2, wherein the plurality of coupling lines and the plurality of scanning lines are in a same layer.

4. The array substrate according in claim 1, wherein the second connecting line comprises a second routing part and a connecting part electrically connected to the second routing part, and a width of the connecting part is greater than a width of the second routing part; and
   wherein in the top view, the connecting part at least partially overlaps the coupling part.

5. The array substrate according in claim 1, wherein a length of the second connecting line is greater than a length of the first connecting line.

6. The array substrate according in claim 4, wherein a routing shape of the second connecting line is in a form of serpentine routing.

7. The array substrate according in claim 1, wherein the plurality of fanout lines further comprise a plurality of third fanout lines, and a resistance any one of the plurality of third fanout lines adjacent to the first fanout line is greater than a resistance of another one of the plurality of third fanout lines adjacent to the second fanout line;
   the plurality of signal lines further comprise a plurality of third signal lines;
   the plurality of connecting lines further comprise a plurality of third connecting lines located between the first connecting line and the second connecting line, and the plurality of third connecting lines are electrically connected between the plurality of third signal lines and the plurality of third fanout lines; and
   wherein in the top view, a width of the coupling part adjacent to the first connecting line is less than a width of the coupling part adjacent to the second connecting line, and an overlapping area between any one of the plurality of third connecting lines and the coupling part adjacent to the first connecting line is less than an overlapping area between another one of the plurality of third connecting lines and the coupling part adjacent to the second connecting line.

8. The array substrate according in claim 7, wherein the at least one of the plurality of coupling lines comprises a plurality of coupling parts, and the plurality of coupling parts comprise a plurality of first coupling parts and a plurality of second coupling parts; and
   wherein in the top view, the second connecting line overlaps the plurality of second coupling parts, the plurality of third connecting lines overlap the plurality of first coupling parts, and an overlapping area between any one of the plurality of third connecting lines and the first coupling part adjacent to the first connecting line is less than an overlapping area between another one of the plurality of third connecting lines and the first coupling part adjacent to the second connecting line.

9. The array substrate according in claim 1, wherein the plurality of fanout lines comprise a first fanout line, a second fanout line, and a plurality of third fanout lines, a resistance of the first fanout line is greater than a resistance of the second fanout line, and a resistance of any one of the plurality of third fanout lines adjacent to the first fanout line is greater than a resistance of another one of the plurality of third fanout lines adjacent to the second fanout line;
   the plurality of signal lines comprise a first signal line, a second signal line, and a plurality of third signal lines;
   the plurality of connecting lines comprise a first connecting line, a second connecting line, and a plurality of third connecting lines, the first connecting line is electrically connected between the first signal line and the first fanout line, the second connecting line is electrically connected between the second signal line and the second fanout line, and the plurality of third connecting lines are electrically connected between the plurality of third signal lines and the plurality of third fanout lines; and
   wherein a length of the second connecting line is greater than a length of the first connecting line, and a length of any one the plurality of third connecting lines adjacent to the first connecting line is less than a length of another one of the plurality of third connecting lines adjacent to the second connecting line.

10. The array substrate according in claim 1, wherein an extending direction of the plurality of coupling lines is equal to an extending direction of the plurality of connecting lines.

11. The array substrate according in claim 1, further comprising virtual scanning lines disposed in the connecting area, wherein the virtual scanning lines are multiplexed as the plurality of coupling lines.

12. A display panel, comprising:
   an array substrate comprising a display area, a fanout area, and a connecting area located between the display area and the fanout area;
   a color film substrate disposed opposite to the array substrate; and
   a frame glue located between the array substrate and the color film substrate, and located on a side of the fanout area away from the connecting area;
   wherein the array substrate further comprises:
   a plurality of fanout lines located in the fanout area, wherein resistances of the plurality of fanout lines are different;
   a plurality of signal lines located in the display area;
   a plurality of connecting lines located in the connecting area, and electrically connected between the plurality of fanout lines and the plurality of signal lines; and
   a plurality of coupling lines located in the connecting area, and disposed in different layers from the plurality of connecting lines; and wherein in a top view, the plurality of connecting lines partially overlap the plurality of coupling lines, and overlapping areas between the plurality of connecting lines and the plurality of coupling lines are negatively correlated with the resistances of the plurality of fanout lines electrically connected to the plurality of connecting lines wherein the plurality of fanout lines comprise a first fanout line and a second fanout line, and a resistance of the first fanout line is greater than a resistance of the second fanout line; the plurality of signal lines comprise a first signal line and a second signal line; and the plurality of connecting lines comprise a first connecting line and a second connecting line, the first connecting line is electrically connected between the first signal line and the first fanout line, and the second connecting line is electrically connected between the second signal line and the second fanout line; at least one of the plurality of coupling lines comprises a first routing part and a coupling part electrically connected to the first routing part, and a width of the first routing part is less than a width of the coupling part, and wherein in the top view, the first connecting line partially overlaps the first routing part, and the second connecting line partially overlaps the coupling part.

13. The display panel according in claim 12, wherein the array substrate further comprises:
   a plurality of scanning lines parallel to the plurality of coupling lines; and
   a plurality of gate driving circuits electrically connected to the plurality of scanning lines and the plurality of coupling lines.

14. The display panel according in claim 13, wherein the plurality of coupling lines and the plurality of scanning lines are in a same layer.

15. A display panel, comprising:
   an array substrate comprising a display area, a fanout area, and a connecting area located between the display area and the fanout area; and
   a light-emitting device layer located on the array substrate, wherein the light-emitting device layer comprises a plurality of light-emitting devices electrically connected to a plurality of signal lines of the array substrate;
   wherein the array substrate further comprises:
   a plurality of fanout lines located in the fanout area, wherein resistances of the plurality of fanout lines are different;
   the plurality of signal lines located in the display area;
   a plurality of connecting lines located in the connecting area, and electrically connected between the plurality of fanout lines and the plurality of signal lines; and
   a plurality of coupling lines located in the connecting area, and disposed in different layers from the plurality of connecting lines; and
   wherein in a top view, the plurality of connecting lines partially overlap the plurality of coupling lines, and overlapping areas between the plurality of connecting lines and the plurality of coupling lines are negatively correlated with the resistances of the plurality of fanout lines electrically connected to the plurality of connecting lines wherein, the plurality of fanout lines comprise a first fanout line and a second fanout line, and a resistance of the first fanout line is greater than a resistance of the second fanout line; the plurality of signal lines comprise a first signal line and a second signal line; the plurality of connecting lines comprise a first connecting line and a second connecting line, the first connecting line is electrically connected between the first signal line and the first fanout line, and the second connecting line is electrically connected between the second signal line and the second fanout line; and at least one of the plurality of coupling lines comprises a first routing part and a coupling part electrically connected to the first routing part, and a width of the first routing part is less than a width of the coupling part; and wherein in the top view, the first connecting line partially overlaps the first routing part, and the second connecting line partially overlaps the coupling part.

16. The display panel according in claim 15, wherein the array substrate further comprises:
   a plurality of scanning lines parallel to the plurality of coupling lines; and
   a plurality of gate driving circuits electrically connected to the plurality of scanning lines and the plurality of coupling lines.

17. The display panel according in claim 16, wherein the plurality of coupling lines and the plurality of scanning lines are in a same layer.

* * * * *